United States Patent
Halbritter

(10) Patent No.: US 10,126,413 B2
(45) Date of Patent: Nov. 13, 2018

(54) METHOD FOR OPERATING AN OPTOELECTRONIC PROXIMITY SENSOR

(71) Applicant: OSRAM Opto Semiconductors GmbH, Regensburg (DE)

(72) Inventor: Hubert Halbritter, Dietfurt (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 304 days.

(21) Appl. No.: 14/904,683

(22) PCT Filed: Jul. 21, 2014

(86) PCT No.: PCT/EP2014/065630
§ 371 (c)(1),
(2) Date: Jan. 12, 2016

(87) PCT Pub. No.: WO2015/011094
PCT Pub. Date: Jan. 29, 2015

(65) Prior Publication Data
US 2016/0170011 A1    Jun. 16, 2016

(30) Foreign Application Priority Data
Jul. 24, 2013 (DE) .......... 10 2013 107 899

(51) Int. Cl.
*G01J 1/32* (2006.01)
*G01S 7/484* (2006.01)
(Continued)

(52) U.S. Cl.
CPC ............ *G01S 7/484* (2013.01); *G01S 7/4868* (2013.01); *G01S 17/026* (2013.01);
(Continued)

(58) Field of Classification Search
CPC ...................................................... G01S 17/026
(Continued)

(56) References Cited

U.S. PATENT DOCUMENTS

| 4,332,468 A | 6/1982 | Stützle |
| 5,142,134 A | 8/1992 | Kunkel |

(Continued)

FOREIGN PATENT DOCUMENTS

| DE | 4019927 A1 | 1/1992 |
| DE | 19639286 C1 | 4/1998 |

(Continued)

OTHER PUBLICATIONS

Proakis, J.G., "Digital Communications," McGraw Hill Education, Dec. 31, 1995, pp. 39-41 and 58-63.
(Continued)

*Primary Examiner* — David Porta
*Assistant Examiner* — Abra Fein
(74) *Attorney, Agent, or Firm* — Slater Matsil, LLP

(57) ABSTRACT

A method can be used for operating an optoelectronic proximity sensor. The proximity sensor includes a radiation-emitting component, a radiation-detecting component and a control unit. The radiation-emitting component is operated by means of a pulsed current. During each measurement period, the pulsed current of the radiation-emitting component has an on-time and an off-time. The pulsed current has a pulse current intensity during the on-time, and the control unit evaluates a detector signal of the radiation-detecting component and lowers the pulse current intensity for a subsequent measurement period, when the detector signal exceeds a threshold value during at least one measurement period.

20 Claims, 3 Drawing Sheets

(51) Int. Cl.
*H03K 17/94* (2006.01)
*H03K 17/96* (2006.01)
*G01S 17/02* (2006.01)
*G01S 7/486* (2006.01)

(52) U.S. Cl.
CPC ....... *H03K 17/941* (2013.01); *H03K 17/9636* (2013.01); *H03K 2217/94042* (2013.01); *H03K 2217/94108* (2013.01)

(58) Field of Classification Search
USPC ........................................................ 250/205
See application file for complete search history.

(56) References Cited

U.S. PATENT DOCUMENTS

| | | | |
|---|---|---|---|
| 5,699,151 A | | 12/1997 | Akasu |
| 9,604,054 B2* | | 3/2017 | Thieme ................ A61B 5/0452 |
| 2003/0219056 A1* | | 11/2003 | Yager ................. G03F 7/70025 |
| | | | 372/57 |
| 2004/0142705 A1 | | 7/2004 | Casebolt et al. |
| 2009/0278473 A1 | | 11/2009 | Van Erp |
| 2010/0201276 A1 | | 8/2010 | Chen et al. |
| 2011/0295537 A1* | | 12/2011 | Akers .................... G01T 1/167 |
| | | | 702/85 |
| 2012/0081031 A1 | | 4/2012 | Kameyama et al. |
| 2013/0050677 A1 | | 2/2013 | Kwong et al. |
| 2015/0022474 A1 | | 1/2015 | Sossenheimer et al. |

FOREIGN PATENT DOCUMENTS

| | | |
|---|---|---|
| DE | 19847548 A1 | 9/1999 |
| DE | 19852173 A1 | 5/2000 |
| DE | 10032864 A1 | 1/2002 |
| DE | 10233139 A1 | 1/2004 |
| DE | 102011081487 A1 | 2/2013 |
| DE | 102012100762 A1 | 8/2013 |
| EP | 0926512 A1 | 6/1999 |
| FR | 2685092 A1 | 6/1993 |
| GB | 2355523 A | 4/2001 |
| JP | 11148974 A | 6/1999 |
| JP | 2010199706 A | 9/2010 |

OTHER PUBLICATIONS

Sossenheimer, D. et al., "Proximity Sensor SFH 7741—Application Note," OSRAM Opto Semiconductors, Oct. 27, 2010, 7 pages.
Stojetz, B., "Ambient Light and Proximity Sensor SFH 7770—Application Note," OSRAM Opto Semiconductors, Jan. 25, 2011, 28 pages.

* cited by examiner

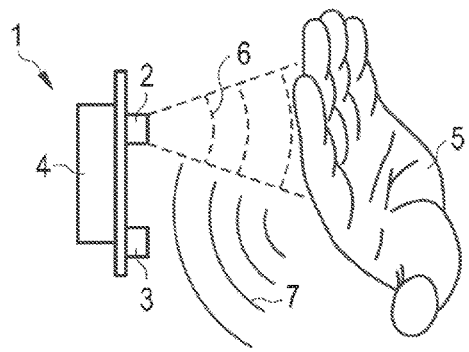
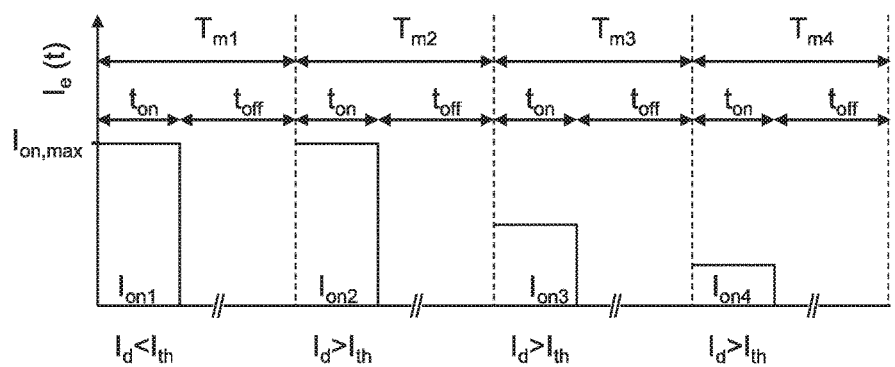
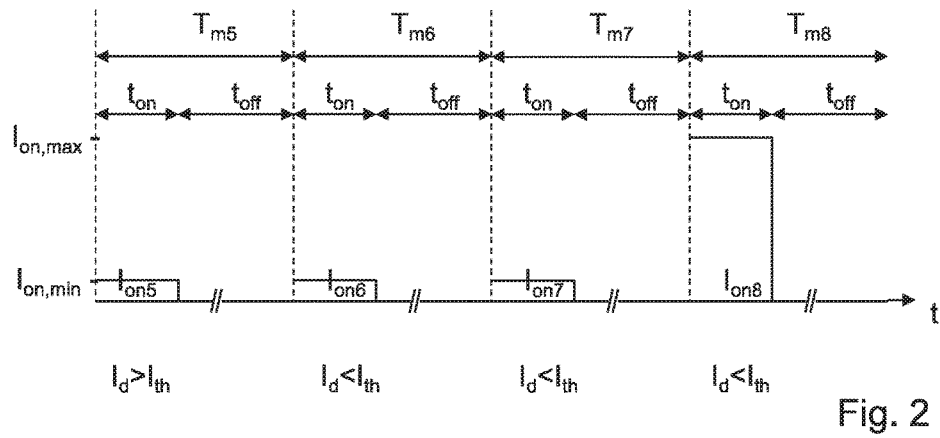
Fig. 1
Fig. 2

METHOD FOR OPERATING AN OPTOELECTRONIC PROXIMITY SENSOR

This patent application is a national phase filing under section 371 of PCT/EP2014/065630, filed Jul. 21, 2014, which claims the priority of German patent application 10 2013 107 899.0, filed Jul. 24, 2013, each of which is incorporated herein by reference in its entirety.

TECHNICAL FIELD

The present invention relates to a method for operating an optoelectronic proximity sensor.

BACKGROUND

Optoelectronic proximity sensors are generally used to detect the approach of an object and, if necessary, to trigger a switching operation. For example, an optoelectronic proximity sensor may be used to switch an electronic device on or off if it is touched by a user, or a body part of the user is situated at a short distance from the device.

An optoelectronic proximity sensor typically comprises a radiation-emitting component and a radiation-detecting component situated next to it, wherein the radiation-detecting component receives the radiation of the radiation-emitting component reflected by an object if such an object is situated near the optoelectronic proximity sensor. In other words, the function of an optoelectronic proximity sensor is based on the principle of a reflection light barrier.

In order to achieve a high sensitivity and/or an extensive range of the optoelectronic proximity sensor, the radiation-emitting component must be operated at a comparatively high current intensity. The current consumption of an optoelectronic proximity sensor is therefore essentially determined by the current consumption of the radiation-emitting component.

SUMMARY

Embodiments of the present invention provide a method for operating an optoelectronic proximity sensor in which the current consumption of the radiation-emitting component is reduced, without significantly affecting the sensitivity and/or the range of the optoelectronic proximity sensor.

In the method for operating an optoelectronic proximity sensor, according to one embodiment, the proximity sensor includes at least one radiation-emitting component. The radiation-emitting component is preferably a radiation-emitting semiconductor component. The radiation-emitting component is preferably an LED, in particular an infrared LED. For example, an infrared LED having a wavelength between approximately 850 nm and 940 nm may be used.

Furthermore, the optoelectronic proximity sensor includes a radiation-detecting component. The radiation-detecting component is suitable for detecting the radiation of the radiation-emitting component which is reflected by an object. The radiation-detecting component is preferably a radiation-detecting semiconductor component, for example, a photodiode or a phototransistor.

Furthermore, the optoelectronic proximity sensor includes a control unit. The control unit is provided in particular for controlling the radiation-emitting component and the radiation-detecting component and for evaluating a detector signal of the radiation-detecting component. The control unit may, for example, output a logical output signal as a function of whether or not a detector signal of the radiation-detecting component exceeds a threshold value, for example, "L" if no object is situated near the proximity sensor and the threshold value of the detector signal is thus not exceeded, or "H" if an object is situated near the proximity sensor and the threshold value of the detector signal is thus exceeded. An output signal of the control unit may, for example, be used to trigger an electrical switching operation.

The radiation-emitting component is advantageously operated via a pulsed current. In this way, a measurement is carried out at periodic intervals to determine whether or not an object is situated near the proximity sensor. The measurement period $T_m$, i.e., the period of the pulsed current of the radiation-emitting component, may, for example, be between 1 ms inclusively and 2000 ms inclusively. During a measurement period $T_m$, the pulsed current of the radiation-emitting component has an on-time $t_{on}$ and an off-time $t_{off}$. The on-time is preferably significantly shorter than the off-time and also significantly shorter than the measurement period $T_m$. The on-time $t_{on}$ may, for example, be between 1 µs and 100 ms inclusively. The duty cycle $t_{on}/T_m$ of the pulsed current of the radiation-emitting component is advantageously less than 1/10, preferably less than 1/100, or even less than 1/1000. In this way, it is advantageously achieved that the radiation-emitting component is operated only during a small fraction of the measurement period, whereby the current consumption of the optoelectronic proximity sensor is reduced.

The pulsed current of the radiation-emitting component has a pulse current intensity during the on-time $t_{on}$. An advantageous reduction of the current consumption of the optoelectronic proximity sensor is achieved according to the principle provided here in that the control unit evaluates a detector signal of the radiation-emitting component and reduces the pulse current intensity for a subsequent measurement period if the detector signal exceeds a threshold value during at least one measurement period.

If an object is detected by the optoelectronic proximity sensor, so that the detector signal exceeds the threshold value during at least one measurement period, the pulse current intensity at which the radiation-emitting component is operated during the on-time is advantageously reduced. In this way, the current consumption of the optoelectronic proximity sensor may be advantageously reduced in comparison to an optoelectronic proximity sensor in which the current of the radiation-emitting component has a fixedly predefined pulse current intensity.

The pulse current intensity during the on-time of the pulsed current is thus a function of the strength of the detector signal and decreases with increasing proximity of an object to the optoelectronic proximity sensor, and/or with increasing reflection of the radiation of the radiation-emitting component by the object. The provided principle makes use of the finding that, during a period of time in which a reflecting object is situated near the proximity sensor, a lower pulse current intensity of the radiation-emitting component is sufficient to detect whether the object continues to be situated near the optoelectronic proximity sensor.

Since the pulse current intensity of the pulsed current of the radiation-emitting component is reduced only if the detector signal exceeds the threshold value, the sensitivity of the optoelectronic proximity sensor is not reduced during periods in which no object is situated near the optoelectronic proximity sensor which causes a sufficiently high detector signal. By adjusting the pulse current intensity of the pulsed current, a reduction of the current consumption of the radiation-emitting component is therefore advantageously achieved during periods in which an object is situated near the optoelectronic proximity sensor, without reducing the sensitivity during periods in which no object is situated near the optoelectronic proximity sensor.

In one embodiment of the method, the pulse current intensity for a subsequent measurement period is reduced if the detector signal exceeds the threshold value during exactly one measurement period. In this embodiment, the control unit reduces the pulse current intensity after a only a single overshooting of the threshold value during a measurement period, so that the pulsed current already has a lower pulse current intensity during the next measurement period. In this way, a particularly rapid reduction of the current consumption is achieved upon the approach of an object.

In an additional embodiment of the method, the pulse current intensity for a subsequent measurement period is reduced if the detector signal exceeds the threshold value during a predefined number of N consecutive measurement periods, where N≥2. In this embodiment, a reduction of the pulse current intensity is thus not yet carried out in the case of a single overshooting of the threshold value, but rather only if the threshold value is exceeded during N consecutive measurement periods.

In particular, it may be provided that the pulse current intensity for a subsequent measurement period is reduced only if the detector signal has exceeded the threshold value during N=2 or N=3 consecutive measurement periods. If the reduction of the pulse current intensity is carried out only after a multiple overshooting of the threshold value, very short-duration, in particular random, approaches of an object to the optoelectronic proximity sensor have no influence on the control.

In an additional advantageous embodiment, the pulse current intensity is reduced at least one additional time for at least one additional subsequent measurement period if the detector signal continues to exceed the threshold value during at least one additional measurement period after the reduction of the pulse current intensity. In this way, the pulse current intensity may be advantageously incrementally reduced multiple times as long as the detector signal still exceeds the threshold value. Thus, the closer an object is situated to the proximity sensor and the better the object reflects, the lower the current consumption of the optoelectronic proximity sensor.

The reduction of the pulse current intensity in one or in multiple steps may, for example, be carried out in fixedly predefined steps. In one advantageous embodiment, the pulse current intensity is reduced, for example, by at least 25% or even by at least 50%.

In the method, it may be provided that the pulse current intensity is reduced only as far as a predefined minimum value. In this embodiment, after reaching the minimum value, the pulse current intensity is not further reduced if the detector signal falls below the threshold value.

According to one advantageous embodiment of the method, the pulse current intensity for a subsequent measurement period is increased if the detector signal falls below a threshold value during at least one measurement period, and the pulse current intensity is less than a predefined maximum value for the pulse current intensity. In this way, the sensitivity of the optoelectronic proximity sensor is again advantageously increased if an object moves away from the proximity sensor in such a way that the detector signal no longer exceeds the threshold value.

Similarly to decreasing the pulse current intensity in the case of exceeding the threshold value, increasing the pulse current intensity for the subsequent measurement period may be carried out if the detector signal falls below the threshold value during exactly one measurement period.

Alternatively, the pulse current intensity for the subsequent measurement period may be increased if the detector signal falls below the threshold value during a predefined number of N consecutive measurement periods, where N≥2. For example, it may be provided that the pulse current intensity is increased only if the detector signal falls below the threshold value during N=2 or N=3 consecutive measurement periods. In this case, very short periods of falling below the threshold value which, for example, are triggered via a short-duration movement of a detected object, have no influence on the control.

In one embodiment, the pulse current intensity is increased to a predefined maximum value for the pulse current intensity if the detector signal falls below the threshold value during one or multiple consecutive measurement periods. In this case, after increasing the pulse current intensity, the optical proximity sensor again immediately reaches a maximum sensitivity, which is reached at the maximum value of the pulse current intensity.

In an alternative embodiment, the pulse current intensity is increased at least one additional time for at least one additional subsequent measurement period if the detector signal continues to fall below the threshold value during at least one additional measurement period after increasing the pulse current intensity. In this variant, for example, the pulse current intensity is increased incrementally until the detector signal no longer falls below the threshold value. In this way, the pulse current intensity may advantageously be adjusted incrementally to a varying distance of the object from the optoelectronic proximity sensor and a resulting variation of the detector signal.

Increasing the pulse current intensity in the case of falling below the threshold value may be carried out in the method, for example, in fixedly predefined steps. Preferably, the pulse current intensity is increased by at least 50% or even 100% if the detector signal falls below the threshold value.

BRIEF DESCRIPTION OF THE DRAWINGS

The present invention is described in greater detail based on exemplary embodiments, with respect to FIGS. 1 to 4.

FIG. 1 shows a schematic representation of an optoelectronic proximity sensor in one exemplary embodiment of the method;

FIG. 2 shows a schematic graphical representation of the time profile of the current $I_e(t)$ of the radiation-emitting component, in one exemplary embodiment of the method;

Figure 3:
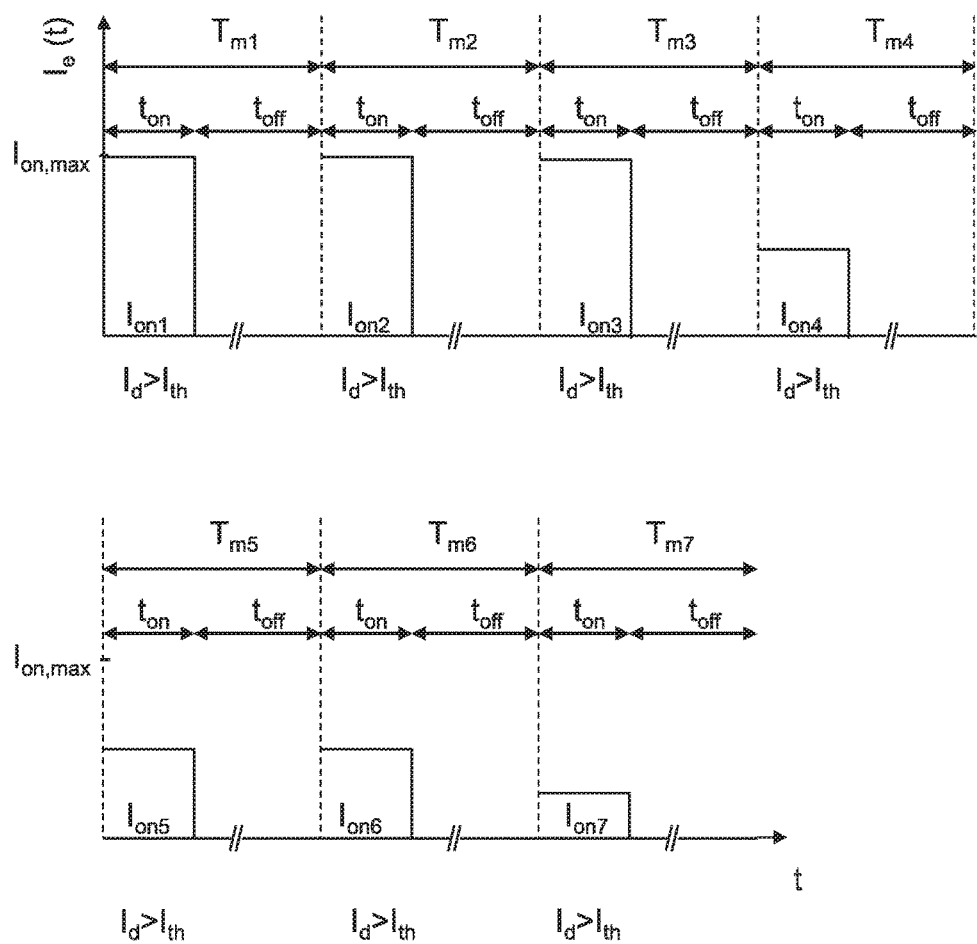
FIG. 3 shows a schematic graphical representation of the time profile of the current $I_e(t)$ of the radiation-emitting component, in an additional exemplary embodiment of the method.

The depicted component parts and the ratios of the dimensions of the component parts are not to be considered to be true to scale.

DETAILED DESCRIPTION OF ILLUSTRATIVE EMBODIMENTS

The optoelectronic proximity sensor 1 according to one exemplary embodiment which is depicted in FIG. 1 includes a radiation-emitting component 2 and a radiation-detecting component 3. The radiation-emitting component 2 and the radiation-detecting component 3 may, for example, be installed next to each other on a shared printed circuit board. The radiation-emitting component 2 is preferably a radiation-emitting semiconductor component. The radiation-emitting component 2 is, for example, a light-emitting diode, in particular an infrared light-emitting diode. In particular, the radiation-emitting component 2 may be an IR LED which, for example, has a wavelength between approximately 850 nm and 940 nm.

The radiation-emitting component 2 emits electromagnetic radiation 6 in a radiation direction. If an object 5 is situated near the optoelectronic proximity sensor 1, the electromagnetic radiation 6 emitted by the radiation-emitting component 2 is reflected by it. The reflecting object 5 may in particular be a body part of a user who uses an electrical device into which the optoelectronic proximity sensor 1 is integrated. If the reflecting object 5 is situated near the optoelectronic proximity sensor 1, at least a portion of the electromagnetic radiation 7 reflected by the object 5 strikes the radiation-detecting component 3. The radiation-detecting component 3 is preferably a radiation-detecting semiconductor component, for example, a photodiode, a phototransistor, or another semiconductor component, which is suitable for the detection of the reflected radiation 7.

Furthermore, the optoelectronic proximity sensor 1 includes a control unit 4 which is provided in particular for the electrical control of the radiation-emitting component 2 and the radiation-detecting component 3. The control unit 4 is also used for the evaluation of a detector signal of the radiation-detecting component 3. The control unit 4 may, for example, include an integrated circuit (IC), in particular an application-specific integrated circuit (ASIC). It is also possible that the radiation-detecting component 3 and/or the radiation-emitting component 2 is a semiconductor component which is integrated into an ASIC functioning as a control unit. For example, the radiation-detecting semiconductor component 3 may be a photodiode integrated monolithically into an ASIC.

In the case of the optoelectronic proximity sensor 1, the radiation-emitting component 2 is operated at a pulsed current intensity. An exemplary time profile of the pulsed current intensity $I_e(t)$ is schematically depicted in FIG. 2. During a measurement period $T_m$, the radiation-emitting component 2 is switched on during an on-time $t_{on}$ and subsequently switched off for the remaining time $t_{off}$ of the measurement period $T_m$. The measurement period $T_m$ is preferably between 1 ms and 2000 ms inclusively.

During the on-time, the radiation-emitting component is operated at a pulse current intensity $I_{on}$. The on-time $t_{on}$ is preferably significantly shorter than the off-time $t_{off}$. The duty cycle $t_{on}/T_m$ is advantageously less than 0.1, preferably less than 0.01, and particularly preferably less than 0.001.

In the example depicted in FIG. 2, in a first measurement period $T_{m1}$, a detector signal $I_d$ is detected which is smaller than the threshold value $I_{th}$. Since the pulse current intensity $I_{on1}$ already has a predefined maximum value $I_{on,max}$, the pulse current intensity $I_{on2}$ is not increased in the subsequent second measurement period $T_{m2}$. In the exemplary embodiment, the detector signal $I_d$ exceeds the threshold value $I_{th}$ during the second measurement period $T_{m2}$ because, for example, a reflecting object is situated near the optical proximity sensor. In this case, the pulse current intensity $I_{on3}$ for the subsequent measurement period $T_{m3}$ is advantageously reduced by the control unit to a lower value.

Preferably, the pulse current intensity is reduced by at least 25%. In the exemplary embodiment, the pulse current intensity $I_{on3}$ during the third measurement period $T_{m3}$ is reduced by 50% with respect to the preceding measurement period $T_{m2}$.

In the exemplary embodiment, during the third measurement period $T_{m3}$, despite the reduced pulse current intensity $I_{on3}$, radiation reflected by an object near the optoelectronic proximity sensor is still sufficient for the detector signal $I_d$ to continue to exceed the threshold value $I_{th}$. In this case, the pulse current intensity $I_{on4}$ for the subsequent fourth measurement period $T_{m4}$ is again reduced, for example, by another 50%.

Since the detector signal $I_d$ also continues to be greater than the threshold value $I_{th}$ during the fourth measurement period $T_{m4}$, the pulse current intensity $I_{on5}$ for the subsequent fifth measurement period $T_{m5}$ is again reduced, for example, again by 50%.

Despite the additional reduction of the pulse current intensity $I_{on5}$, the detector signal $I_d$ also continues to be greater than the threshold value $I_{th}$ during the fifth measurement period $T_{m5}$.

In the method, it may be provided that the pulse current intensity $I_{on}$ is not further reduced if it has reached a predefined minimum value $I_{on,min}$. In this case, the pulse current intensity $I_{on}$ for the subsequent measurement period $T_m$ is also not reduced if the detector signal $I_d$ has fallen below the threshold value $I_{th}$ during the preceding measurement period $T_m$.

In the exemplary embodiment of FIG. 2, for example, the pulse current intensity $I_{on5}$ in the fifth measurement period $T_{m5}$ has reached a predefined minimum value $I_{on,min}$. The control unit 4 therefore does not further reduce the pulse current intensity $I_{on6}$ for the subsequent measurement period $T_{m6}$, although the detector signal $I_d$ has exceeded the threshold value $I_{th}$. Rather, the radiation-emitting component 2 is also operated at the predefined minimum value $I_{on,min}$ of the pulse current intensity during the sixth measurement period $T_{m6}$.

In the method, the control device 4 is preferably configured to increase the pulse current intensity $I_{on}$ again if the detector signal $I_d$ has fallen below the threshold value $I_{th}$ during at least one measurement period and the pulse current intensity $I_{on}$ is less than a predefined maximum value $I_{on,max}$ for the pulse current intensity. Such an increase of the pulse current intensity $I_{on}$ after falling below the threshold value $I_{th}$ does not necessarily have to take place for the immediately subsequent measurement period $T_m$, but may, for example, take place only if the detector signal $I_d$ has fallen below the threshold value $I_{th}$ during a predefined number N of measurement periods. A very short-duration reduction of the detector signal $I_d$, which, for example, is based on a short-duration movement of the detected object 5, thus remains unconsidered.

In the exemplary embodiment of FIG. 2, it is assumed that the detector signal $I_d$ falls below the threshold value $I_{th}$ during the sixth measurement period $T_{m6}$ because, for example, a previously detected object 5 has moved away from the optoelectronic proximity sensor 1. During the seventh measurement period $T_{m7}$, the radiation-emitting component 2 is operated at a pulse current intensity $I_{on7}$, which is equal to the pulse current intensity $I_{on6}$ of the sixth measurement period $T_{m6}$, although the detector signal $I_d$ has fallen below the threshold value $I_{th}$ during the sixth measurement period $T_{m6}$.

The pulse current intensity $I_{on8}$ is increased for the subsequent eighth measurement period $T_{m8}$ by the control unit 4 only after the detector signal $I_d$ has again fallen below the threshold value $I_{th}$ during the seventh measurement period $T_{m7}$. In the exemplary embodiment, the pulse current intensity $I_{on8}$ for the eighth measurement period $T_{m8}$ is increased to a predefined maximum pulse current intensity $I_{on,max}$ which was the initial value during the first measurement period $T_{m1}$. Alternatively, it would also be possible to increase the pulse current intensity incrementally in the direction of the maximum value $I_{on,max}$, as was also carried out during the reduction of the pulse current intensity in the case of falling below the threshold value $I_{th}$.

FIG. 3 schematically depicts another exemplary embodiment of the time profile of the pulsed current $I_e(t)$ of the radiation-emitting component. Unlike the preceding exemplary embodiment, in this exemplary embodiment, a reduction of the pulse current intensity is not already carried out if the detector signal $I_d$ has fallen below the threshold value $I_{th}$ during exactly one measurement period $T_m$, but rather, only if the detector signal $I_d$ has exceeded the threshold value $I_{th}$ during an established number of N=3 measurement periods $T_m$.

In the exemplary embodiment, for example, during each of the first three measurement periods $T_{m1}$, $T_{m2}$, $T_{m3}$, the threshold value $I_{th}$ is exceeded by the detector signal $I_d$. Thus, there is a reduction of the pulse current intensity $I_{on4}$ for the subsequent fourth measurement period $T_{m4}$. This may, for example, be a halving of the pulse current intensity $I_{on2}=I_{on3}$. In the exemplary embodiment, during the fourth, fifth, and sixth measurement periods $T_{m4}$, $T_{m5}$, $T_{m6}$, the threshold value $I_{th}$ continues to be exceeded by the detector signal $I_d$. Since the threshold value $I_{th}$ has therefore again been exceeded N=3 times, the pulse current intensity $I_{on7}$ for the subsequent seventh measurement period $T_{m7}$ is again reduced, for example, again halved.

As in the first exemplary embodiment, in the further progression, the pulse current intensity may again be increased in one step or in multiple steps up to a maximum pulse current intensity $I_{on,max}$ if the threshold value $I_{th}$ was undershot during a predefined number of N measurement periods $T_m$.

Figure 4:
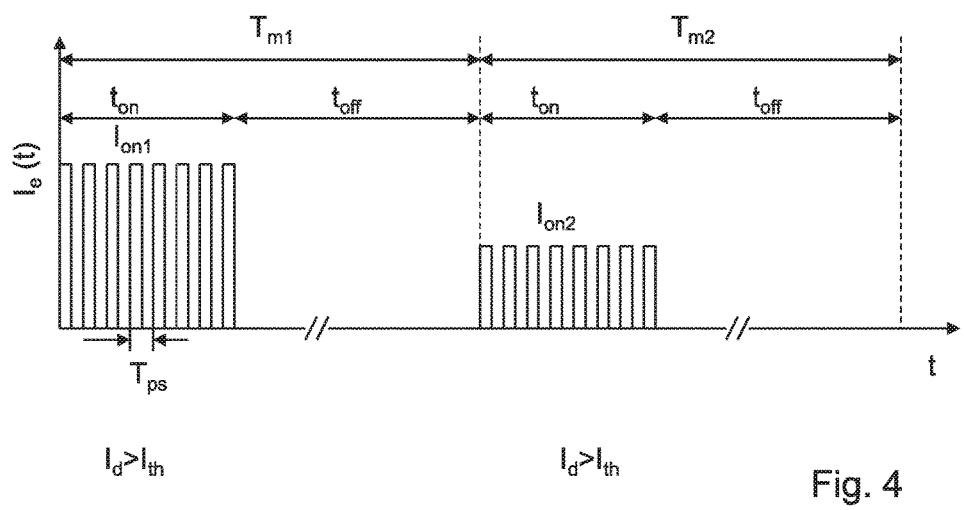
FIG. 4 shows a schematic graphical representation of the time profile of the current $I_e(t)$ of the radiation-emitting component, in an additional exemplary embodiment of the method.

In one embodiment of the optoelectronic proximity sensor 1, during the on-time $t_{on}$, the radiation-emitting component 2 does not emit a single pulse, but rather a pulse sequence. In this embodiment, the time profile of the pulsed current $I_e(t)$ is schematically depicted in FIG. 4 for two measurement periods $T_{m1}$, $T_{m2}$.

The pulsed current $I_e(t)$ includes a sequence of rectangular pulses during the on-time $t_{on}$. During a measurement period $T_m$, the radiation-emitting component is switched off after the pulse sequence for an off-time $t_{off}$. In this embodiment, the on-time $t_{on}$ may be understood to be the duration of the pulse sequence. The pulse sequence has a period $T_{ps}$ which is preferably significantly shorter than the measurement period $T_m$. For example, $T_{ps}/T_m<1/10$, preferably, $T_{ps}/T_m<1/100$, or even $T_{ps}/T_m<1/1000$. The short-period modulation of the pulsed current $I_e(t)$ of the radiation-emitting component 2 during the on-time $t_{on}$ is also advantageously ascertainable in the detector signal $I_d$ and is used in particular for reducing the signal-noise ratio. By evaluating the detector signal, for example, non-modulated components of the detector signal which, for example, result via the influence of ambient light, may be filtered out. In this embodiment, the pulse current intensity $I_{on1}$, $I_{on2}$ is understood to be the amplitude of the pulses of the pulse sequence. In the exemplary embodiment of FIG. 4, the pulse current intensity $I_{on2}$ is halved in comparison to $I_{on1}$, since the detector signal $I_d$ has exceeded the threshold value during the first measurement period $T_{m1}$.

The present invention is not limited by the description based on the exemplary embodiments. Rather, the present invention comprises any new feature and any combination of features, which in particular includes any combination of features in the patent claims, even if this feature or this combination itself is not explicitly specified in the patent claims or exemplary embodiments.

The invention claimed is:

1. A method for operating an optoelectronic proximity sensor that comprises a radiation-emitting component, a radiation-detecting component, and a control unit, the method comprising:
    operating the radiation-emitting component with a pulsed current that has an on-time and an off-time during one measurement period, wherein the pulsed current has a pulse current intensity during the on-time and wherein the measurement period is between 1 ms and 2000 ms;
    using the control unit to evaluate a detector signal from the radiation-detecting component; and
    reducing the pulse current intensity for a subsequent measurement period when the detector signal exceeds a threshold value during at least one measurement period.

2. The method according to claim 1, wherein the pulse current intensity for a subsequent measurement period is reduced when the detector signal exceeds the threshold value during exactly one measurement period.

3. The method according to claim 1, wherein the pulse current intensity for a subsequent measurement period is reduced when the detector signal exceeds the threshold value during a predefined number of N consecutive measurement periods, where N≥2.

4. The method according to claim 3, wherein N=2 or N=3.

5. The method according to claim 1, wherein the pulse current intensity is reduced for at least one additional subsequent measurement period when the detector signal continues to exceed the threshold value during at least one additional measurement period after the reducing the pulse current intensity.

6. The method according to claim 1, wherein reducing the pulse current intensity comprises reducing the pulse current intensity by at least 25%.

7. The method according to claim 6, wherein reducing the pulse current intensity comprises reducing the pulse current intensity by at least 50%.

8. The method according to claim 1, wherein the pulse current intensity for a subsequent measurement period is increased when the detector signal falls below a threshold value during at least one measurement period, and the pulse current intensity is less than a predefined maximum value for the pulse current intensity.

9. The method according to claim 8, wherein the pulse current intensity for a subsequent measurement period is increased when the detector signal falls below the threshold value during exactly one measurement period.

10. The method according to claim 8, wherein the pulse current intensity for a subsequent measurement period is increased when the detector signal falls below the threshold value during a predefined number of N consecutive measurement periods, where N≥2.

11. The method according to claim 10, wherein N=2 or N=3.

12. The method according to claim 8, wherein the pulse current intensity is increased to the predefined maximum value for the pulse current intensity.

13. The method according to claim 8, wherein the pulse current intensity is increased at least one additional time for at least one additional subsequent measurement period when the detector signal continues to fall below the threshold value during at least one additional measurement period after increasing the pulse current intensity.

14. The method according to claim 8, wherein increasing the pulse current intensity comprises increasing the pulse current intensity by at least 50%.

15. An optoelectronic proximity sensor, comprising:
a radiation-emitting component configured to be operated via a pulsed current that has an on-time and an off-time during one measurement period, wherein the pulsed current has a pulse current intensity during the on-time and wherein the measurement period is between 1 ms and 2000 ms;
a radiation-detecting component configured to generate a detector signal; and
a control unit configured to evaluate the detector signal and reduce the pulse current intensity for a subsequent measurement period when the detector signal exceeds a threshold value during at least one measurement period.

16. The optoelectronic proximity sensor according to claim 15, wherein the pulse current intensity for the subsequent measurement period is reduced when the detector signal exceeds the threshold value during a predefined number of N consecutive measurement periods, where N≥2.

17. A method for operating an optoelectronic proximity sensor that comprises a radiation-emitting component, a radiation-detecting component, and a control unit, the method comprising:

operating the radiation-emitting component with a pulsed current that has an on-time and an off-time during one measurement period, wherein the pulsed current has a pulse current intensity during the on-time;
using the control unit to evaluate a detector signal from the radiation-detecting component;
reducing the pulse current intensity for a subsequent measurement period when the detector signal exceeds a threshold value during at least one measurement period; and
increasing the pulse current intensity by at least 50% for a subsequent measurement period when the detector signal falls below a threshold value during at least one measurement period and the pulse current intensity is less than a predefined maximum value for the pulse current intensity.

18. The method according to claim 17, wherein the pulse current intensity for a subsequent measurement period is reduced when the detector signal exceeds the threshold value during exactly one measurement period and wherein the pulse current intensity for a subsequent measurement period is increased when the detector signal falls below the threshold value during exactly one measurement period.

19. The method according to claim 17, wherein the pulse current intensity for a subsequent measurement period is reduced when the detector signal exceeds the threshold value during a predefined number of N consecutive measurement periods, wherein N=2 or N=3; and
wherein the pulse current intensity for a subsequent measurement period is increased when the detector signal falls below the threshold value during a predefined number of N consecutive measurement periods, wherein N=2 or N=3.

20. The method according to claim 17, wherein the measurement period is between 1 ms and 2000 ms.

* * * * *